(12) United States Patent
Huang et al.

(10) Patent No.: US 9,018,968 B2
(45) Date of Patent: Apr. 28, 2015

(54) METHOD FOR TESTING DENSITY AND LOCATION OF GATE DIELECTRIC LAYER TRAP OF SEMICONDUCTOR DEVICE

(75) Inventors: Ru Huang, Beijing (CN); Jibin Zou, Beijing (CN); Changze Liu, Beijing (CN); Runsheng Wang, Beijing (CN); Jiewen Fan, Beijing (CN); Yangyuan Wang, Beijing (CN)

(73) Assignee: Peking University, Beijing (CN)

( * ) Notice: Subject to any disclaimer, the term of this patent is extended or adjusted under 35 U.S.C. 154(b) by 219 days.

(21) Appl. No.: 13/879,967

(22) PCT Filed: Feb. 28, 2012

(86) PCT No.: PCT/CN2012/071708
§ 371 (c)(1),
(2), (4) Date: Apr. 17, 2013

(87) PCT Pub. No.: WO2012/167636
PCT Pub. Date: Dec. 13, 2012

(65) Prior Publication Data
US 2013/0214810 A1 Aug. 22, 2013

(51) Int. Cl.
*G01R 31/02* (2006.01)
*G01R 31/26* (2014.01)
*H01L 21/66* (2006.01)

(52) U.S. Cl.
CPC ........ *G01R 31/2642* (2013.01); *G01R 31/2621* (2013.01); *H01L 22/14* (2013.01); *H01L 22/34* (2013.01)

(58) Field of Classification Search
CPC ........... G01R 31/2621; G01R 31/2648; G01R 31/2642; G01R 31/2831
USPC ................ 324/762.01; 257/E29.309; 438/17
See application file for complete search history.

(56) References Cited

U.S. PATENT DOCUMENTS 5,519,334 A * 5/1996 Dawson .................... 324/754.23
6,391,668 B1 5/2002 Chacon et al.
(Continued)

FOREIGN PATENT DOCUMENTS

CN 101593683 A 12/2009
CN 102053114 A 5/2011
(Continued)

*Primary Examiner* — Melissa Koval
*Assistant Examiner* — Daniel Miller
(74) *Attorney, Agent, or Firm* — Bret E. Field; Bozicevic, Field & Francis LLP

(57) ABSTRACT

Proposed is a method for testing the density and location of a gate dielectric layer trap of a semiconductor device. The testing method tests the trap density and two-dimensional trap location in the gate dielectric layer of a semiconductor device with a small area (the effective channel area is less than 0.5 square microns) using the gate leakage current generated by a leakage path. The present invention is especially suitable for testing a device with an ultra-small area (the effective channel area is less than 0.05 square microns). The present method can obtain trap distribution scenarios of the gate dielectric layer in the case of different materials and different processes. In the present method, the device requirements are simple, the testing structure is simple, the testing cost is low, the testing is rapid and the trap distribution of the gate dielectric layer of the device can be obtained within a short time, which is suitable for large batches of automatic testing and is especially suitable for process monitoring and finished product quality detection during the manufacture of ultra-small semiconductor devices.

6 Claims, 5 Drawing Sheets

(56) References Cited

U.S. PATENT DOCUMENTS

| | | |
|---|---|---|
| 7,592,828 B2 | 9/2009 | Song |
| 2007/0152673 A1 | 7/2007 | Song |
| 2007/0213954 A1 | 9/2007 | Price |
| 2012/0176146 A1* | 7/2012 | Oborina et al. ............... 324/658 |

FOREIGN PATENT DOCUMENTS

| | | |
|---|---|---|
| CN | 102353882 A | 2/2012 |
| WO | WO 2007103933 A1 | 9/2007 |

* cited by examiner

METHOD FOR TESTING DENSITY AND LOCATION OF GATE DIELECTRIC LAYER TRAP OF SEMICONDUCTOR DEVICE

CROSS-REFERENCES TO RELATED APPLICATION

The present application claims priority to Chinese Patent Application No. 201110153759.X, filed with State Intellectual Property Office on Jun. 9, 2011, which is incorporated herein by reference in its entirety.

FIELD OF THE INVENTION

An embodiment of the present invention refers to a method for testing reliability of a semiconductor device, and particularly refers to a method for testing a trap density and a trap location of a gate dielectric layer in a semiconductor device by using a gate current through percolation paths.

BACKGROUND OF THE INVENTION

Semiconductor devices are essential elements in producing electronic products. Updates of the semiconductor devices have been a driving force for development of semiconductor technologies and progress of semiconductor industry, especially for elevation of the performance of central processing units (CPU) and memories. Since the end of the last century, the process for manufacturing chips has been developed rapidly, the level of which has been increased from micrometer level to less than 32 nm.

Under the background that photolithography technologies have a limitation to be further improved, as well as advanced photolithography technologies are impossible to be used to achieve a mass production, continually reducing sizes of minimum patterns would imply a constant increase of the cost and a decrease of the yield. At present, taking a 32 nm planar transistor technology as an example, which has reached to a technology limitation, various serious short-channel effects may be introduced, and meanwhile a raising of an off-state current and a lowering of a transconductance, etc. of the planar transistor may be caused. When a new process is about to be put into use, tests for reliability of gate dielectric of a semiconductor device manufactured by such process become an important subject. Since electron traps and hole traps in the gate dielectric layer of the semiconductor device, i.e. certain dangling bonds or socalled defects, would cause a drift of a threshold voltage of the semiconductor device and a decrease of an on-state current, thus resulting in a serious negative/positive bias temperature instability (NBTI/PBTI), and at the same time would cause an increase of a gate-drain current to decrease the reliability and the life span of the semiconductor device, researches and tests on the traps in the dielectric layer may provide an optimal solution for manufacturing the device, and tests of reliability with respect to traps is one of the important manners for characterizing the life span of the semiconductor device.

A relatively precise method for testing traps for conventional planar transistor devices is a charge pump test. However, the method cannot be used in a semiconductor device that has an ultra-small area. As to a novel device, such as a 32 nm device using a bulk silicon process, there is an effective channel area of less than 0.002 square micrometers. In other words, in an advanced process condition, the number of traps in each semiconductor device is smaller. If the charge pump test for the conventional planar transistor device is used, the test can be only performed on relatively large devices. However, the actual situation of the traps in the ultra-small devices cannot be represented. Further, if the charge pump test is directly performed on the ultra-small devices, there may be a substantial error in the test result. Therefore, the traditional charge pump test can not be used in the present novel device, especially in the process under 22nm. Currently, the test of the number/density/location of the traps in the gate dielectric layer of the ultra-small device has become a focus issue in manufacturing integrated circuits.

SUMMARY OF THE INVENTION

An object of the present invention is directed to fill in a blank of the conventional technology, and to provide a method for testing a trap density and a two-dimensional trap location in a gate dielectric layer of a semiconductor device having an ultra-small area by using a gate current through percolation paths.

A technical solution of the present invention is as follows.

A method for testing a trap density and a trap location in a gate dielectric layer of a semiconductor device, wherein the method tests the trap density and the two-dimensional trap location in the gate dielectric layer of a small-area semiconductor device (the effective channel area is less than 0.5 square micrometers) by using a gate percolation current formed with a percolation path, characterized in that, the method comprises:

A. firstly, performing a structure modification on the semiconductor device to be tested, as shown in FIG. 1 and FIG. 2, the modified area includes a channel region, a gate dielectric layer, a source region and a drain region as well as a gate region; four lead-out terminals A1, A2, B1 and B2 are formed in four different directions from a gate region, and each end of the four terminals is connected to the gate region, and thus they are associated with each other; the terminals A1 and A2 are along a channel direction, and the terminals B1 and B2 are along a channel width direction;

B. subsequently, performing the following steps;

1) obtaining the trap density and a trap distribution in the gate dielectric layer on a side adjacent to the terminal A1 along the channel direction:

the terminals A1 and A2 are connected to two test voltage signals respectively, and the terminals B1 and B2 are floating; a source and a drain of the semiconductor device are floating and are not connected to any electrical signal; and one end of an ampere meter is connected to a substrate of the semiconductor device, and the other end thereof is grounded, so as to measure a substrate current;

the terminal A2 is grounded, a voltage at the terminal A1 is set to V1, the voltage at the terminal A1 is gradually varied from V1 to V2, and at this time the terminal A1 is a stressed terminal; an incremental step of the voltage is Vstep1; when the semiconductor device is an n-type transistor, each of V1, V2 and Vstep1 has a positive value; and when the semiconductor device is a p-type transistor, each of V1, V2 and Vstep has a negative value;

a substrate current IB1 is monitored while the voltage at the terminal A1 is varied;

2) obtaining a trap density and a trap distribution in the gate dielectric layer on a side adjacent to the terminal A2 along the channel direction:

the terminals A1 and A2 are connected to two test voltage signals respectively, and the terminals B1 and B2 are floating; the source and the drain of the semiconductor device are floating and are not connected to any electrical signals; and one end of the ampere meter is connected to the substrate of the semiconductor device, and the other end thereof is grounded, so as to measure the substrate current;

the terminal A1 is grounded, a voltage at the terminal A2 is set to V3, the voltage at the terminal A2 is gradually varied from V3 to V4, and at this time the terminal A2 is the stressed terminal; an incremental step of the voltage is Vstep2; when the semiconductor device is an n-type transistor, each of V3, V4 and Vstep2 has a negative value; and when the semiconductor device is a p-type transistor, each of V3, V4 and Vstep2 has a positive value;

a substrate current IB2 is monitored when the voltage at the terminal A2 is varied;

3) obtaining a trap density and a trap distribution in the gate dielectric layer on a side adjacent to the terminal B1 along the channel width direction:

the terminals B1 and B2 are connected to two test voltage signals respectively, and the terminals A1 and A2 are floating and is not connected to any electrical signal; the source and the drain of the semiconductor device are floating and are not connected to any electrical signals; and one end of the ampere meter is connected to a substrate of the semiconductor device, and the other end thereof is grounded, so as to measure the substrate current;

the terminal B2 is grounded, a voltage at the terminal B1 is set to V5, the voltage at the terminal B1 is gradually varied from V5 to V6, and at this time the terminal B1 is a stressed terminal; an incremental step of the voltage is Vstep3; when the semiconductor device is an n-type transistor, each of V5, V6 and Vstep3 has a positive value; and when the semiconductor device is a p-type transistor, each of V5, V6 and Vstep3 has a negative value;

a substrate current Ib3 is monitored when the voltage at the terminal B1 is varied;

4) obtaining a trap density and a trap distribution in the gate dielectric layer on a side adjacent to the terminal B2 along the channel width direction:

the terminals B1 and B2 are connected to two test voltage signals respectively, and the terminal A1 and A2 are floating and is not connected to any electrical signal; the source and the drain of the semiconductor device are floating and are not connected to any electrical signals; and one end of the ampere meter is connected to the substrate of the semiconductor device, and the other end thereof is grounded, so as to measure the substrate current;

the terminal B1 is grounded, a voltage at the terminal B2 is set to V7, the voltage at the terminal B2 is gradually varied from V7 to V8, and at this time the terminal B2 is the stressed terminal; the incremental step of the voltage is Vstep4; when the semiconductor device is an n-type transistor, each of V7, V8 and Vstep4 has a negative value; and when the semiconductor device is a p-type transistor, each of V7, V8 and Vstep4 has a positive value;

a substrate current Ib4 is monitored when the voltage at the terminal B2 is varied;

5) obtaining IbL by combining IB2 to the end of Ib1, and obtaining IbW by combining Ib4 to the end of Ib3, the obtained IbL and IbW comprise information about traps; and information about the trap density and the two-dimensional trap distribution in the gate dielectric layer of the semiconductor device is calculated with derivative peaks of IbL and IbW.

In the step 1), the value range of V1 is 0 volt~±0.2 volts; the value range of V2 is 0 volt~±5 volts; and the value range of Vstep1 is 0 volt~±0.1 volts.

In the step 2), the value range of V3 is 0 volt~±0.2 volts; the value range of V4 is 0 volt~±5 volts; and the value range of Vstep2 is 0 volt~±0.1 volts.

In the step 3), the value range of V5 is 0 volt~±0.2 volts; the value range of V6 is 0 volt~±5 volts; and the value range of Vstep3 is 0 volt~±0.1 volts.

In the step 4), the value range of V7 is 0 volt~±0.2 volts; the value range of V8 is 0 volt~±5 volts; and the value range of Vstep4 is 0 volt~±0.1 volts.

In the step 5), the method for calculating the information about the trap density and the two-dimensional trap distribution in the gate dielectric layer of the semiconductor device comprises:

calculating the number N of steps in IbL as shown in FIG. 6(a) or FIG. 6(b) by using the number of a derivative peak of IbL (the number of the derivative peaks is equal to the number of the steps), wherein each step height is set to I1, I2, I3 . . . IN, respectively, and an equation for calculating the trap density along the channel direction is:

$$NL(x) = IbL \times N / (I1 + I2 + \ldots + IN),$$

in the above equation $x = V \times L / (V2 + V4)$, where V is the voltage at the stressed terminal as shown in FIG. 6, L is a channel length of the semiconductor device, and x represents a location along the channel direction;

similarly, an equation for calculating the trap density along the channel width direction is:

$$NW(y) = IBW \times M / (I1' + I2' + \ldots + IM'),$$

in the above equation $y = V \times W / (V6 + V8)$, where V is the voltage at the stressed terminal as shown in FIG. 6, W is a channel width of the semiconductor device, Y represents a location along the channel width direction, and M is the number of the steps in IbW;

combining NL(x) and NW(y) to draw a two-dimensional diagram as shown in FIG. 7, and the information about the trap density and the two-dimensional trap distribution in the semiconductor gate dielectric layer is recorded in a top view of the gate dielectric layer;

Wherein different steps represent different percolation paths, and the step height represents a current difference.

The method for testing the trap in the gate dielectric layer of the semiconductor device according to the present invention can test the quality of the gate dielectric layer of the small device (the effective channel area is less than 0.5 square micrometers), and is particularly suitable to the device having an ultra-small area (the effective channel area is less than 0.05 square micrometers). According this method, a distribution of traps in the gate dielectric layer in cases of various materials and various processes can be obtained. In the method according to the present invention, the test instruments required are simple, the structure for performing tests is simple, and the cost for tests is low. Further, tests can be performed rapidly, and the distribution of the traps in the gate dielectric of the device can be obtained in a short time, thus the method may be applicable to mass automatic tests. Further, the operation is compatible with the typical reliability test (the charge pump) and is easy to be operated, and thus is suitable for process monitoring and product quality examination during ultra-small semiconductor device manufacturing.

BRIEF DESCRIPTION OF THE DRAWINGS

FIG. 3(a) is a schematic diagram showing the current flow direction in the gate when leading-out terminals A1, A2 are controlled and leading-out terminals B1, B2 are floating, which is applied to the test steps 1) and 2). FIG. 3(b) is a schematic diagram showing the current flow direction in the gate when the leading-out terminals B1, B2 are controlled and leading-out terminals A1, A2 are floating, which is applied to the test steps 3) and 4).

Figure 1:
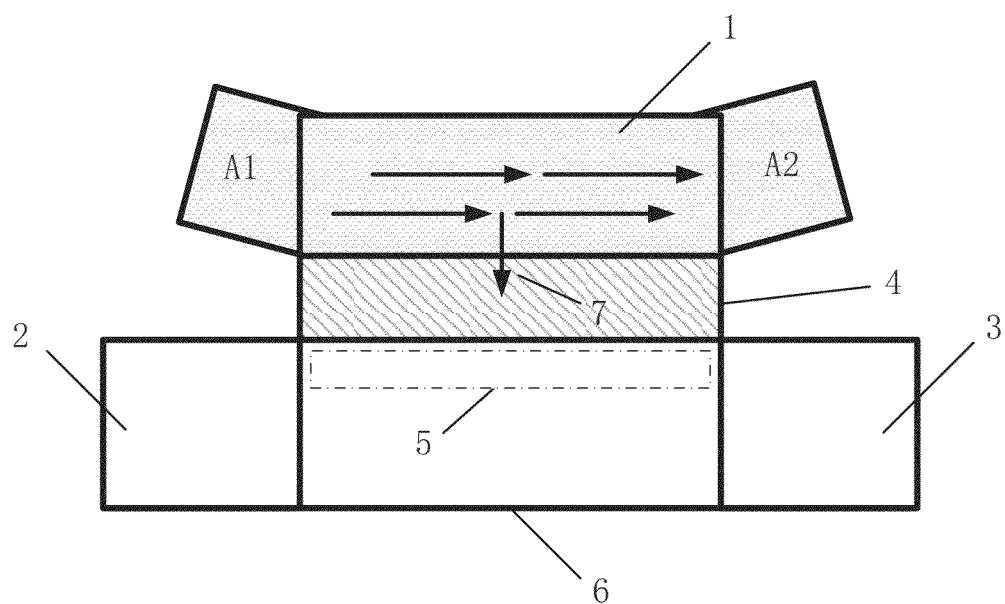
FIG. 1 is a cross-sectional view along a channel direction of a semiconductor device to be tested according to an embodiment of the present invention.

Reference numbers in the drawings of the present invention are described as follows.

1—gate region; 2—source terminal; 3—drain terminal; 4—gate dielectric layer; 5—channel region; 6—substrate; 7—gate percolation current; 8—electric field in channel direction in the gate region; 9—electric field in channel width direction in the gate region; 10—traps that are not occupied by carriers; 11—traps occupied by carriers; 12—interface between the gate region and the gate dielectric layer; 13—interface between the gate dielectric layer and the channel region; 14—boundary between a high and a low electric field; 15—high electric field region; 16—low electric field region; 17—a first gate percolation current through the percolation path; 18—a second gate percolation current through the percolation path; 19—step-wise gate percolation current; 20—height of the first step; 21—a step-wise-like gate percolation current; 22—peak P1 of a derivative of the gate percolation current; 23—peak P2 of a derivative of the gate percolation current; 24—trap density in the channel width direction; 25—trap density in the channel direction; 26—area S1 having a large trap density; 27—area S2 having a large trap density; 28—top view of a gate dielectric layer.

DETAILED DESCRIPTION OF THE EMBODIMENTS

Hereinafter, a test method according to an embodiment of the present invention will be described in detail with reference to the accompany drawings.

Figure 2:
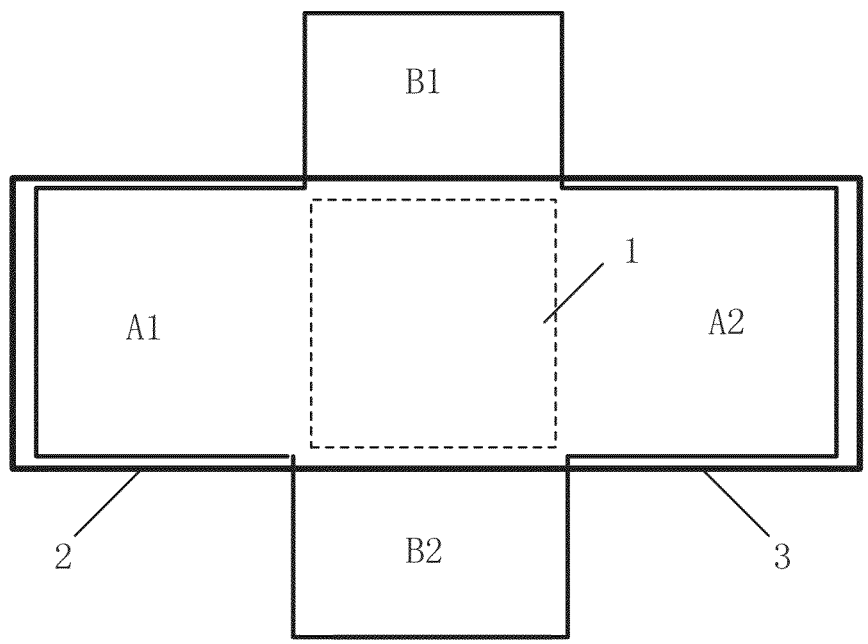
FIG. 2 is top view of a gate region and four leading-out terminals thereof.

First of all, it should be noted that the test method according to the present invention makes a modification based on a general semiconductor device, wherein terminals A1, A2, B1 and B2 are led out in four different directions from a gate region, respectively. Since one end of each connecting line of the four terminals is the gate region, the four terminals are associated with each other. Terminals A1 and A2 are in a channel direction, and terminals B1 and B2 are in a channel width direction, as shown in FIG. 1 and FIG. 2. FIG. 1 shows a cross-sectional view along the channel direction, and FIG. 2 shows a top view of the gate region and the four lead-out terminals thereof.

The test steps are as follows.

1) An object of this test step is to obtain the trap density and distribution in a gate dielectric layer on the side adjacent to the terminal A1 along the channel direction. The terminals A1 and A2 are connected to two test voltage signals respectively, and the terminals B1 and B2 are floating. As such, the terminals A1 and A2 can be controlled such that a current in the gate region as shown in FIG. 1 is generated. Electron-hole pairs are generated under an effect of an electric field by carriers in the gate region. Under the effect of the electric field, a portion of the carriers penetrates into the gate dielectric layer to form a gate percolation current. The gate percolation current then enters, under the effect of the electric field, a channel region, and finally flows out from a substrate. In order to measure a substrate current, that is, the gate percolation current (the substrate current is equal to the gate percolation current), one end of an ampere meter is connected to the substrate of the semiconductor device, and the other end thereof is grounded. In order to ensure that the current passing through the channel region is not absorbed by a source/drain of the semiconductor device, the source/drain is floating, that is, is not connected to any electric signal.

Figure 3:
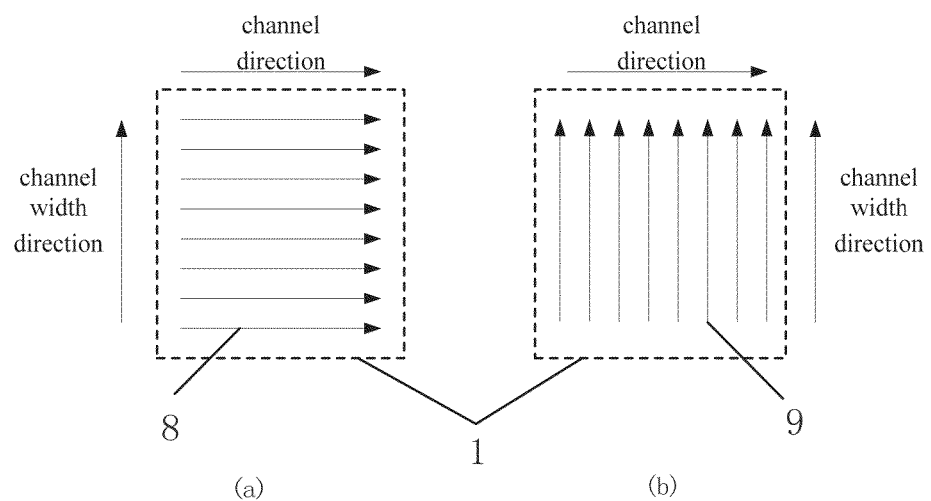
FIG. 3 is a schematic diagram showing a current flow direction in the test step 1) to test step 4).
Figure 4:
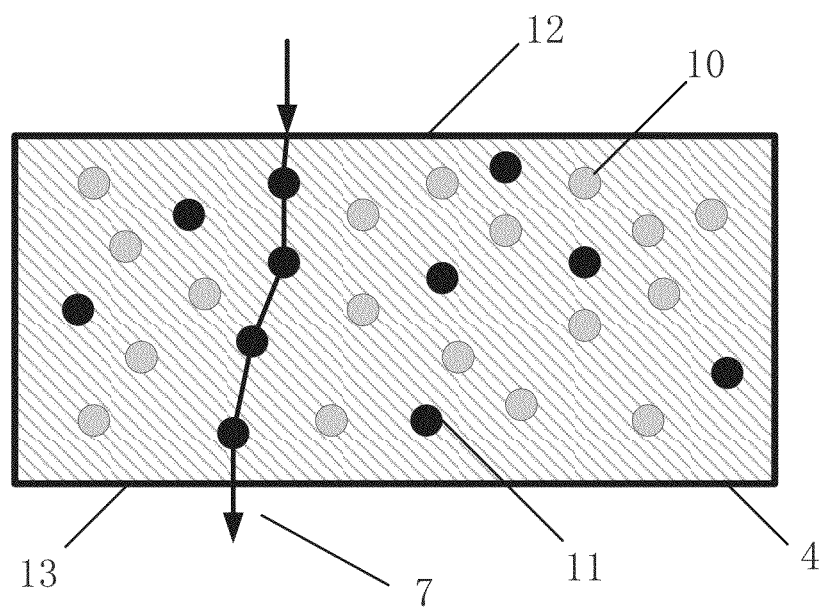
FIG. 4 is a schematic diagram showing traps and percolation paths in a gate dielectric layer.
Figure 5:
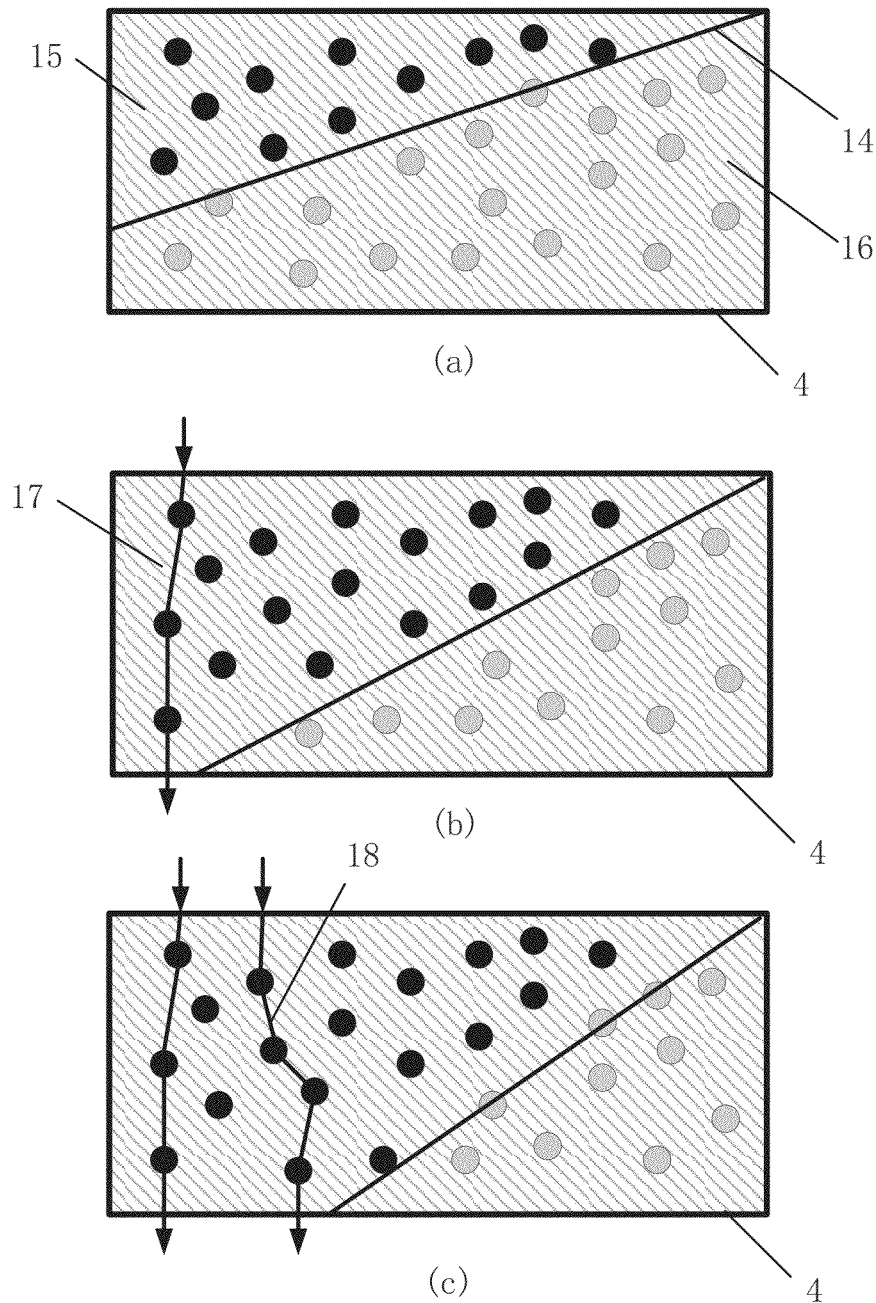
FIG. 5 is a schematic diagram showing an electric field in the gate dielectric layer and a formation process of percolation paths in the gate dielectric layer, when the voltage at the terminals A1, A2, B1, B2 is varied.

As shown in FIG. 1, the lead-out terminal A2 is grounded, while the terminal A1 is used as a stressed terminal. A voltage at the terminal A1 is set to V1 initially, and then is gradually increased or decreased from V1 to V2. When the semiconductor device to be tested is an n-type transistor, each of V1, V2 and Vstep1 has a positive value. When the semiconductor device to be tested is a p-type transistor, each of V1, V2 and Vstep has a negative value. At this time, a direction of the electric field in the gate region is shown with an electric field 8 along the channel direction in the gate region in FIG. 3(a). Here, since the substrate is grounded, a relatively high electric field may exist in the gate dielectric layer as well. Under an effect of such electric field, carriers are trapped in the traps 10 that are not occupied by carriers, and traps 11 that are occupied by carriers are formed as shown in FIG. 4. When these traps that are occupied by carriers are connected with each other to form a percolation path, a gate percolation current 7 as shown in FIG. 4 is generated. A flowing path of the gate percolation current is as follows: from the gate region, the gate percolation current passes through an interface 12 between the gate region and the gate dielectric layer, enters the gate dielectric layer, then passes through an interface 13 between the gate dielectric layer and the channel region, enters the channel region, and finally flows into the substrate under the effect of the electric field. Vstep1 is used as a step to gradually change the voltage at the terminal A1. FIG. 5 shows a test of a variation of the electric field intensity in the gate dielectric layer. FIG. 5(a) is a schematic diagram showing a case in which the voltage at the terminal A1 is relatively low. A high electric field region 15 and a low electric field region 16 as shown in FIG. 5(a) are generated due to the voltages at the terminals A1 and A2, and are divided by a boundary 14 between the high electric field region and the low electric field region. In the high electric field region, traps that are occupied by carriers are formed by trapping carriers. In the low electric field region, however, all the traps are not occupied by carriers. FIG. 5(b) shows a first gate percolation current formed after the voltage at the terminal A1 is varied. FIG. 5(c) shows that the voltage at the terminal A1 is continuously varied to form a second gate percolation current. If the voltage at the terminal A1 is continued to be varied, it is predictable that a third gate percolation current, a fourth gate percolation current and even more gate percolation current will be generated. As shown in FIG. 5, the voltage at the stressed terminal is associated with the position of the high electric field at the interface between the channel and the gate dielectric layer.

Meanwhile, a substrate current Ib1 (that is, the total gate percolation current) is monitored. If an area of the channel of the device to be tested is less than 0.5 square micrometers, a current shape as shown in FIG. 6(a) is formed. Each step of Ib1 represents that a new percolation path is generated. When the voltage at the terminal A1 is varied, a first step is generated on the gate percolation current, as shown by a first step height 20 in FIG. 6(a). If factors such as external interferences, instability of the device and the like in a practical test are to be considered, the shape of Ib1 changes approximately to that shown in FIG. 6(b). If a differentiation is performed on Ib1, a pattern as shown in FIG. 6(c) is obtained, wherein each peak represents an obvious gate percolation current in the position of the peak.

2) An object of this step is to obtain a trap density and distribution in the gate dielectric layer on the side adjacent to the terminal A2 along the channel direction. The terminals A1 and A2 are connected to two test voltage signals respectively, and the terminals B1 and B2 are floating.

Terminal A1 is grounded. The voltage at the terminal A2 is set to V3 initially, and then is gradually increased or decreased from V3 to V4. An incremental step of the voltage is Vstep2. When the semiconductor device to be tested is an n-type transistor, each of V3, V4 and Vstep2 has a positive value. When the semiconductor device to be tested is a p-type transistor, each of V3, V4 and Vstep2 has a negative value. By performing this step, it is equivalent to reverse left and right in the high electric field region.

A substrate current Ib2 is detected when the voltage at the terminal A2 is varied. The detailed process and principle are the same as that of the step 1).

3) An object of this step is to obtain a trap density and distribution in the gate dielectric layer on the side adjacent to the terminal B1 along the channel width direction. The terminals B1 and B2 are connected to two test voltage signals respectively, and the terminals A1 and A2 are floating. At this time, the terminal B1 is a stressed terminal, and information about traps along the channel width direction can be obtained by controlling the terminals B1 and B2. The terminal B2 is grounded. The voltage at the terminal B1 is set to V5 initially, and then is gradually increased or decreased from V5 to V6. An incremental step of the voltage is Vstep3. When the semiconductor device to be tested is an n-type transistor, each of V5, V6 and Vstep3 has a positive value. When the semiconductor device to be tested is a p-type transistor, each of V5, V6 and Vstep3 has a negative value. In this step, the direction of the electric field in the gate region is as shown in the electric field 9 along the channel direction in the gate region in FIG. 3(b).

A substrate current Ib3 is detected when the voltage at the terminal B1 is varied.

4) An object of this step is to obtain a trap density and distribution in the gate dielectric layer on the side adjacent to the terminal B2 along the channel width direction. The terminals B1 and B2 are connected to two test voltage signals respectively, and the terminals A1 and A2 are floating. The terminal B1 is grounded. The voltage at the terminal B2 is set to V7 initially, and then is gradually increased or decreased from V7 to V8. An incremental step of the voltage is Vstep4. When the semiconductor device to be tested is an n-type transistor, each of V7, V8 and Vstep4 has a positive value. When the semiconductor device to be tested is a p-type transistor, each of V7, V8 and Vstep4 has a negative value.

A substrate current Ib4 is detected when the voltage at the terminal B2 is varied.

5) By controlling the voltage at the stressed terminal in each step, information about half of the traps along the channel direction or the channel width direction are obtained by Ib1, Ib2, Ib3 and Ib4, respectively. IbL is obtained by combining Ib2 to the end of Ib1, and IbW is obtained by combining Ib4 to the end of Ib3. The obtained IbL and IbW include information about all of the traps.

Thereafter, the number of the steps as shown in FIGS. 6(a) and 6(b) in IbL is calculated with the number of derivative peaks of IbL (the number of the derivative peaks is equal to the number of the steps). Here, the number is set to N. In the N steps, each step height is set to I1, I2, I3 ... IN, respectively. An average step height can be calculated as (I1+I2+ ... + IN)/N. Thus, by using IbL obtained from the step 1) and the step 2), an equation for calculating the trap density along the channel direction is as follows:

$$NL(x)=IbL \times N/(I1+I2+\ldots+IN)$$

Figure 6:
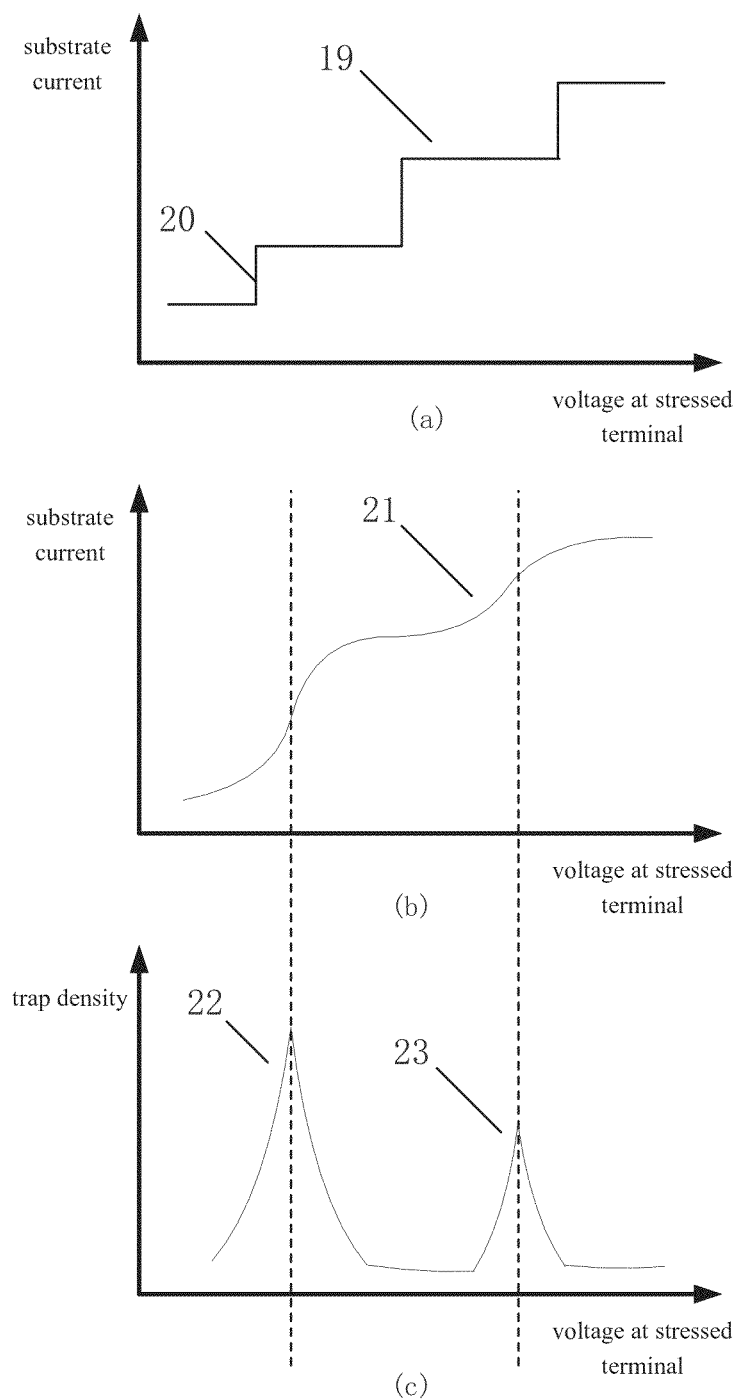
FIG. 6 is a schematic diagram of tested substrate currents Ib1, Ib2, Ib3, Ib4 and a derivative of the substrate current.

In the above equation, x=V×L/(V2+V4), where V is the voltage at the stressed terminal as shown in FIG. 6 and L is a channel length of the semiconductor device. x represents a position along the channel direction.

Similarly, an equation for calculating the trap density along the channel width direction is as follows:

$$NW(y)=IbW \times M/(I1'+I2'+\ldots+IM')$$

In the above equation, y=V×W/(V6+V8), where V is the voltage at the stressed terminal as shown in FIG. 6 and W is a channel width of the semiconductor device. y represents a position along the channel width direction. M is the number of the steps in IbW.

Figure 7:
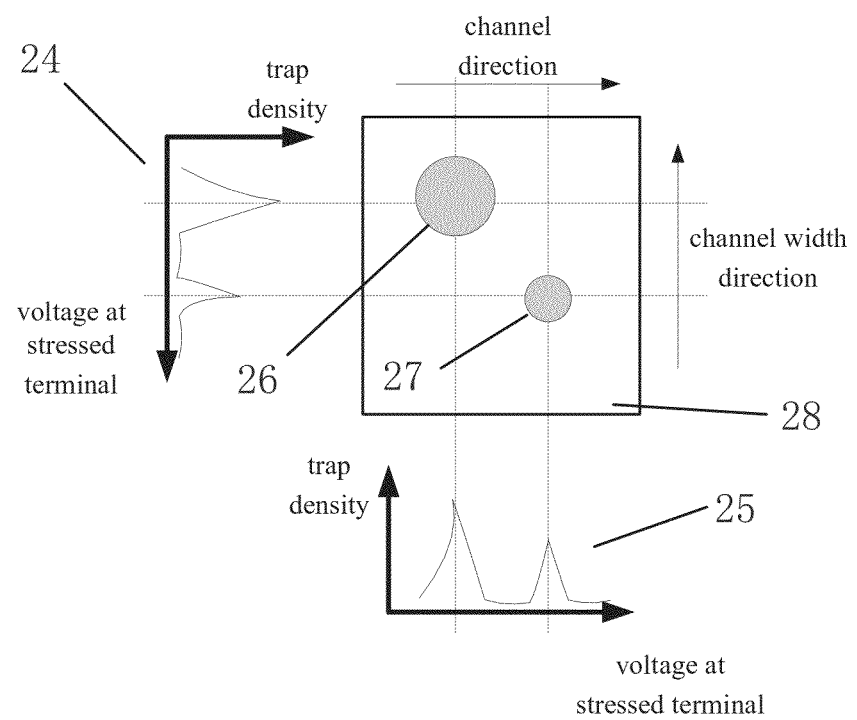
FIG. 7 is a schematic diagram showing a solution for obtaining a trap density and a two-dimensional trap location in the gate dielectric layer by combining information about traps in a channel direction and a channel width direction.

By combining NL(x) and NW(y), a two-dimensional diagram as shown in FIG. 7 can be drawn. In a top view 28 of the gate dielectric layer, information about the trap density and the two-dimensional trap distribution in the semiconductor gate dielectric layer is recorded. For example, the trap density 24 along the channel width direction and the trap density 25 along the channel direction locate an area S1 26 having a large trap density and an area S2 27 having a large trap density.

The method for testing the trap in the gate dielectric layer of the semiconductor device according to the embodiment of the present invention can test the quality of gate dielectric of a small device effectively, and is particularly suitable to an ultra-small device. With the invention, a distribution of traps in the gate dielectric layer in cases of various materials and various processes can be obtained. Meanwhile, the instruments required are simple, the structure for performing tests is simple, the cost for tests is low, and the tests can be performed rapidly, the distribution of the traps in the gate dielectric layer of the device can be obtained in a short time, which is suitable for mass automatic tests. Further, the operation is compatible with the conventional reliability test (the charge pump), hence, it is easy to be operated and it is suitable for process monitoring and product quality examination during ultra-small semiconductor device manufacturing.

What is claimed is:

1. A method for testing a trap density and a two-dimensional trap location in a gate dielectric layer of a semiconductor device, the method comprising:

forming four lead-out terminals A1, A2, B1 and B2 in four different directions from a gate region of the semiconductor device, with an end of each of the four terminals connected to the gate region; with terminals A1 and A2 positioned along a channel direction, and with terminals B1 and B2 positioned along a channel width direction;

subsequent to forming the lead-out terminals:
1) obtaining a first trap density and a first trap distribution in the gate dielectric layer on a side adjacent to the terminal A1 along the channel direction, including:
   maintaining terminals B1 and B2 and a source and a drain of the semiconductor device in a floating state;
   grounding terminal A2 and setting a voltage at terminal A1 to V1, and subsequently varying the voltage at terminal A1 from V1 to V2 in incremental steps of Vstep1 such that terminal A1 is a stressed terminal, wherein when the semiconductor device is an n-type transistor, each of V1, V2 and Vstep1 has a positive value, and when the semiconductor device is a p-type transistor, each of V1, V2 and Vstep has a negative value;
   measuring a current Ib1 in a substrate of the semiconductor device as the voltage at terminal A1 is varied;
2) obtaining a second trap density and a second trap distribution in the gate dielectric layer on a side adjacent to the terminal A2 along the channel direction, including:
   maintaining terminals B1 and B2 and the source and the drain of the semiconductor device in a floating state;
   grounding terminal and setting a voltage at terminal A2 to V3, and subsequently varying the voltage at terminal A2 from V3 to V4 in incremental steps of Vstep2 such that terminal A2 is the stressed terminal, wherein when the semiconductor device is an n-type transistor, each of V3, V4 and Vstep2 has a negative value, and when the semiconductor device is a p-type transistor, each of V3, V4 and Vstep2 has a positive value;
   measuring a current Ib2 in the substrate of the semiconductor device as the voltage at terminal A2 is varied;
3) obtaining a third trap density and a third trap distribution in the gate dielectric layer on a side adjacent to the terminal B1 along the channel width direction, including:
   maintaining terminals A1 and A2 and the source and the drain of the semiconductor device in a floating state;
   grounding terminal B2 and setting a voltage at terminal B1 to V5, and subsequently varying the voltage at terminal B1 from V5 to V6 in incremental steps of Vstep3 such that terminal B1 is a stressed terminal, wherein when the semiconductor device is an n-type transistor, each of V5, V6 and Vstep3 has a positive value, and when the semiconductor device is a p-type transistor, each of V5, V6 and Vstep3 has a negative value;
   measuring a current Ib3 in the substrate of the semiconductor device as the voltage at terminal B1 is varied;
4) obtaining a fourth trap density and a fourth trap distribution in the gate dielectric layer on a side adjacent to the terminal B2 along the channel width direction, including:
   maintaining terminals A1 and A2 and the source and the drain of the semiconductor device in a floating state;
   grounding terminal B1 and setting a voltage at terminal B2 to V7, and subsequently varying the voltage at terminal B2 from V7 to V8 in incremental steps of Vstep4 such that terminal B2 is the stressed terminal, wherein when the semiconductor device is an n-type transistor, each of V7, V8 and Vstep4 has a negative value, and when the semiconductor device is a p-type transistor, each of V7, V8 and Vstep4 has a positive value;
   measuring a current Ib4 in the substrate of the semiconductor device as the voltage at terminal B2 is varied;
5) obtaining a current IbL by combining Ib2 to the end of Ib1, and obtaining a current IbW by combining Ib4 to the end of Ib3, the obtained IbL and IbW comprising information about traps; and
6) determining the trap density and the two-dimensional trap distribution in the gate dielectric layer of the semiconductor device based on a number of derivative peaks in IbL and a number of derivative peaks in IbW.

2. The method according to claim 1, characterized in that, in the step 1), the value range of V1 is 0 volt±0.2 volts; the value range of V2 is 0 volt±5 volts; and the value range of Vstep1 is 0 volt ±0.1 volts.

3. The method according to claim 1, characterized in that, in the step 2), the value range of V3 is 0 volt ±0.2 volts; the value range of V4 is 0 volt ±5 volts; and the value range of Vstep2 is volt±0.1 volts.

4. The method according to claim 1, characterized in that, in the step 3), the value range of V5 0 volt ±0.2 volts; the value range of V6 is 0 volt±5 volts; and the value range of Vstep3 is 0 volt ±0.1 volts.

5. The method according to claim 1, characterized in that, in the step 4), the value range of V7 is 0 volt ±0.2 volts; the value range of V8 is 0 volt±5 volts; and the value range of Vstep4 is 0 volt ±0.1 volts.

6. The method according to claim 1, characterized in that, in the step 6), the method for determining the trap density and the two-dimensional trap distribution in the gate dielectric layer of the semiconductor device comprises:
   calculating a number N of steps in IbL as the number of derivative peak in IbL, wherein each step height is set to I1, I2, I3 ... IN, respectively, and an equation for calculating the trap density along the channel direction is:

$$NL(x)=IbL \times N/(I1+I2+ \ldots +IN),$$

wherein $x=V \times L/(V2+V4)$, where V is the voltage at the stressed terminal, L is a channel length of the semiconductor device, and x represents a location along the channel direction;
   calculating a number M of steps in IbW as the number of derivative peaks in IbW, wherein each step height is set to I1', I2', I3' ... IM', respectively, and an equation for calculating the trap density along the channel width direction is:

$$NW(y)=IbW \times M/(I1'+I2'+ \ldots +IM'),$$

wherein $y=V \times W/(V6+V8)$, where V is the voltage at the stressed terminal, W is the channel width of the semiconductor device, y represents a position along the channel width direction, and M is the number of the steps in IbW;
   combining NL(x) and NW(y) to determine the two-dimensional trap location in the gate dielectric layer;
   wherein different steps represent different percolation paths, and the step height represents a current difference.

* * * * *

UNITED STATES PATENT AND TRADEMARK OFFICE
CERTIFICATE OF CORRECTION

| | | |
|---|---|---|
| PATENT NO. | : 9,018,968 B2 | Page 1 of 1 |
| APPLICATION NO. | : 13/879967 | |
| DATED | : April 28, 2015 | |
| INVENTOR(S) | : Ru Huang et al. | |

It is certified that error appears in the above-identified patent and that said Letters Patent is hereby corrected as shown below:

On the title page insert item (30),

--(30)    Foreign Application Priority Data

June 9, 2011    (CN) ................................ 201110153759.X--

Signed and Sealed this
Eleventh Day of August, 2015

Michelle K. Lee
*Director of the United States Patent and Trademark Office*